(12) United States Patent
Tan et al.

(10) Patent No.: US 10,510,859 B2
(45) Date of Patent: Dec. 17, 2019

(54) REDUCED CAPACITANCE COUPLING EFFECTS IN DEVICES

(71) Applicant: GLOBALFOUNDRIES Singapore Pte. Ltd., Singapore (SG)

(72) Inventors: Shyue Seng Tan, Singapore (SG); Kiok Boone Elgin Quek, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/393,028

(22) Filed: Apr. 24, 2019

(65) Prior Publication Data

US 2019/0252514 A1    Aug. 15, 2019

Related U.S. Application Data

(62) Division of application No. 15/730,745, filed on Oct. 12, 2017, now Pat. No. 10,374,052.

(51) Int. Cl.
*H01L 23/535*    (2006.01)
*H01L 29/49*    (2006.01)
(Continued)

(52) U.S. Cl.
CPC .... *H01L 29/4983* (2013.01); *H01L 21/02189* (2013.01); *H01L 21/02194* (2013.01); *H01L 21/02197* (2013.01); *H01L 23/5226* (2013.01); *H01L 23/535* (2013.01); *H01L 29/40111* (2019.08); *H01L 29/512* (2013.01); *H01L 29/516* (2013.01); *H01L 29/6656* (2013.01);
(Continued)

(58) Field of Classification Search
CPC ............ H01L 23/535; H01L 23/5226; H01L 23/5222; H01L 21/02197; H01L 21/02194; H01L 21/02189
See application file for complete search history.

(56) References Cited

U.S. PATENT DOCUMENTS

2007/0004049 A1    1/2007    Nasu et al.
2011/0090731 A1    4/2011    Chi et al.
(Continued)

OTHER PUBLICATIONS

Lee et al., "Ferroelectricity of HfZrO2 in Energy Landscape With Surface Potential Gain for Low-Power Steep-Slope Transistors", IEEE Journal of the Electron Devices Society, vol. 3, No. 4, pp. 377-381, Jul. 2015.
(Continued)

*Primary Examiner* — Selim U Ahmed
*Assistant Examiner* — Evan G Clinton
(74) *Attorney, Agent, or Firm* — Thompson Hine LLP

(57) ABSTRACT

A semiconductor device with reduce capacitance coupling effect which can reduce the overall parasitic capacitances is disclosed. The semiconductor device includes a gate sidewall spacer with a negative capacitance dielectric layer with and without a dielectric layer. The semiconductor device may also include a plurality of interlevel dielectric (ILD) with a layer of negative capacitance dielectric layer followed by a dielectric layer disposed in-between metal lines in any ILD and combinations. The negative capacitance dielectric layer includes a ferroelectric material which has calculated and selected thicknesses with desired negative capacitance to provide optimal total overlap capacitance in the circuit component which aims to reduce the overall capacitance coupling effect.

20 Claims, 12 Drawing Sheets

(51) Int. Cl.
  *H01L 29/51*    (2006.01)
  *H01L 29/78*    (2006.01)
  *H01L 23/522*   (2006.01)
  *H01L 29/66*    (2006.01)
  *H01L 21/28*    (2006.01)
  *H01L 21/02*    (2006.01)

(52) U.S. Cl.
  CPC ...... *H01L 29/6659* (2013.01); *H01L 29/7833* (2013.01); *H01L 29/78391* (2014.09)

(56) References Cited

U.S. PATENT DOCUMENTS

2013/0320431 A1    12/2013  Su et al.
2018/0053830 A1    2/2018   Cheng et al.

OTHER PUBLICATIONS

Salahuddin et al., "Can the subthreshold swing in a classical FET be lowered below 60 mV/decade?," 2008 IEEE International Electron Devices Meeting, San Francisco, CA, 2008, pp. 1-4.
Salahuddin et al., "Use of negative capacitance to provide a sub-threshold slope lower than 60 mV/decade", School of Electrical and Computer Engineering and NSF Center for Computations Nanotechnology (NCN), Purdue University, West Lafayette, 2007.
K. Li et al., "Sub-60mV-swing negative-capacitance FinFET without hysteresis," 2015 IEEE International Electron Devices Meeting (IEDM), Washington, DC, 2015, pp. 22.6.1-22.6.4.

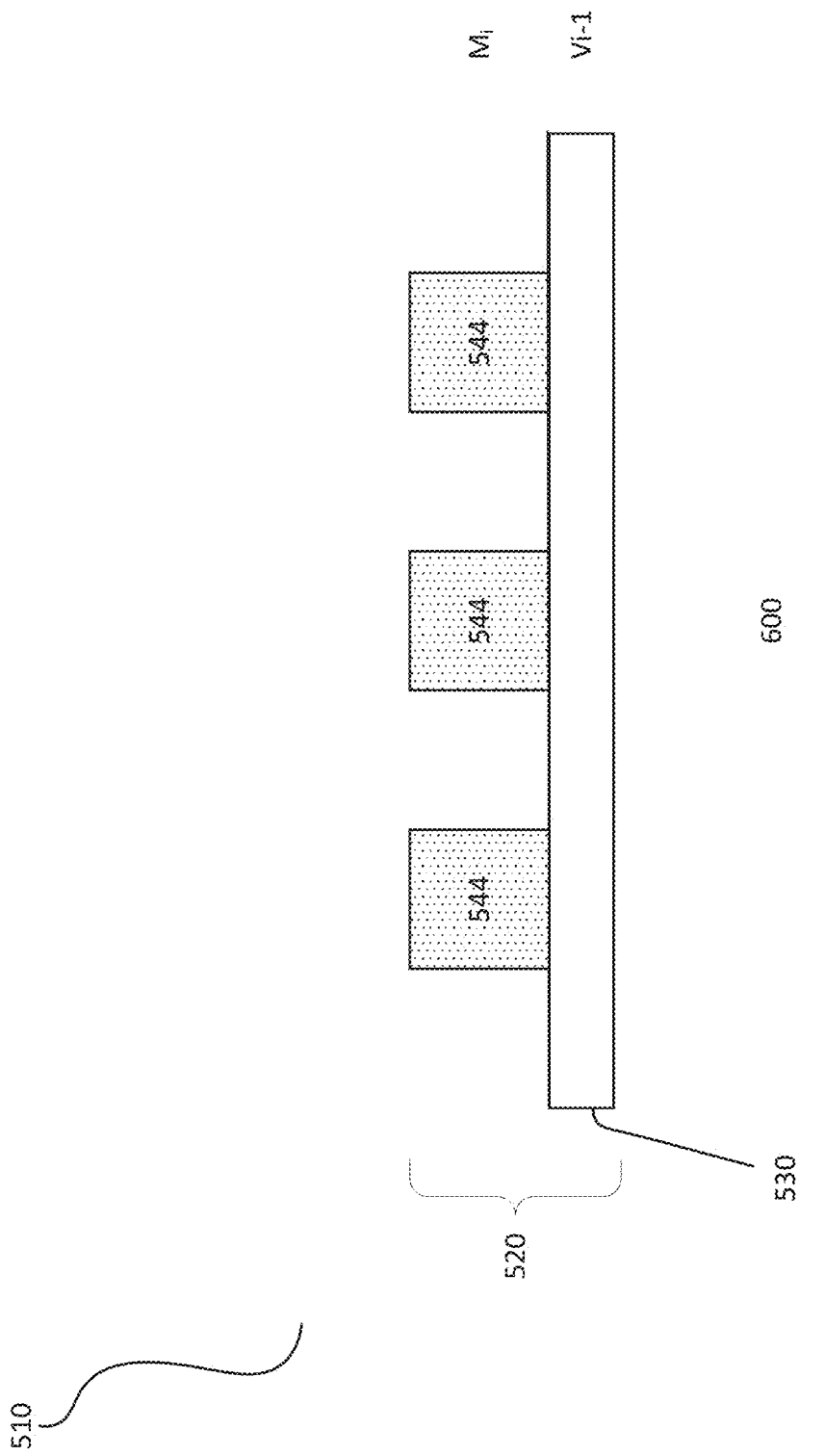

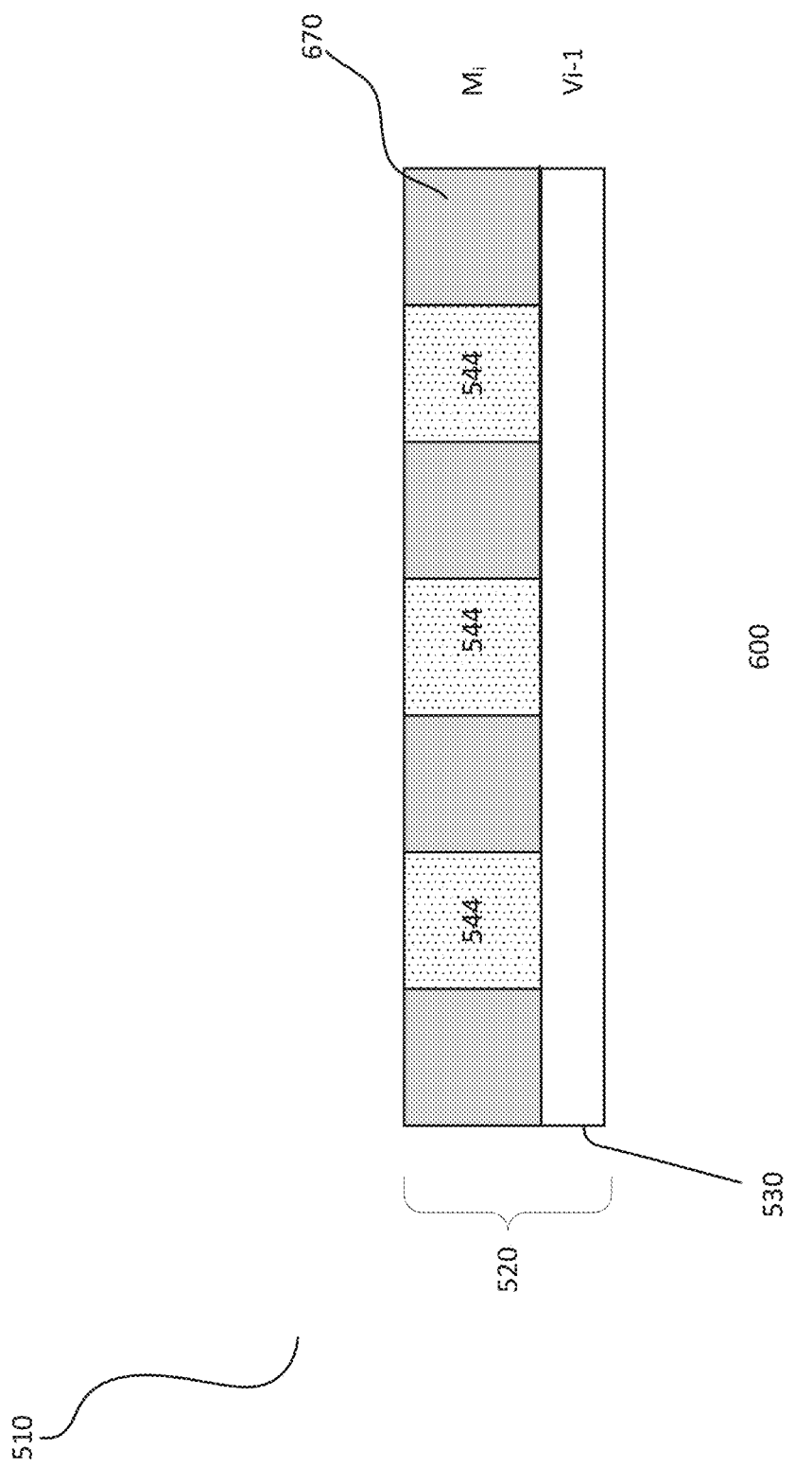

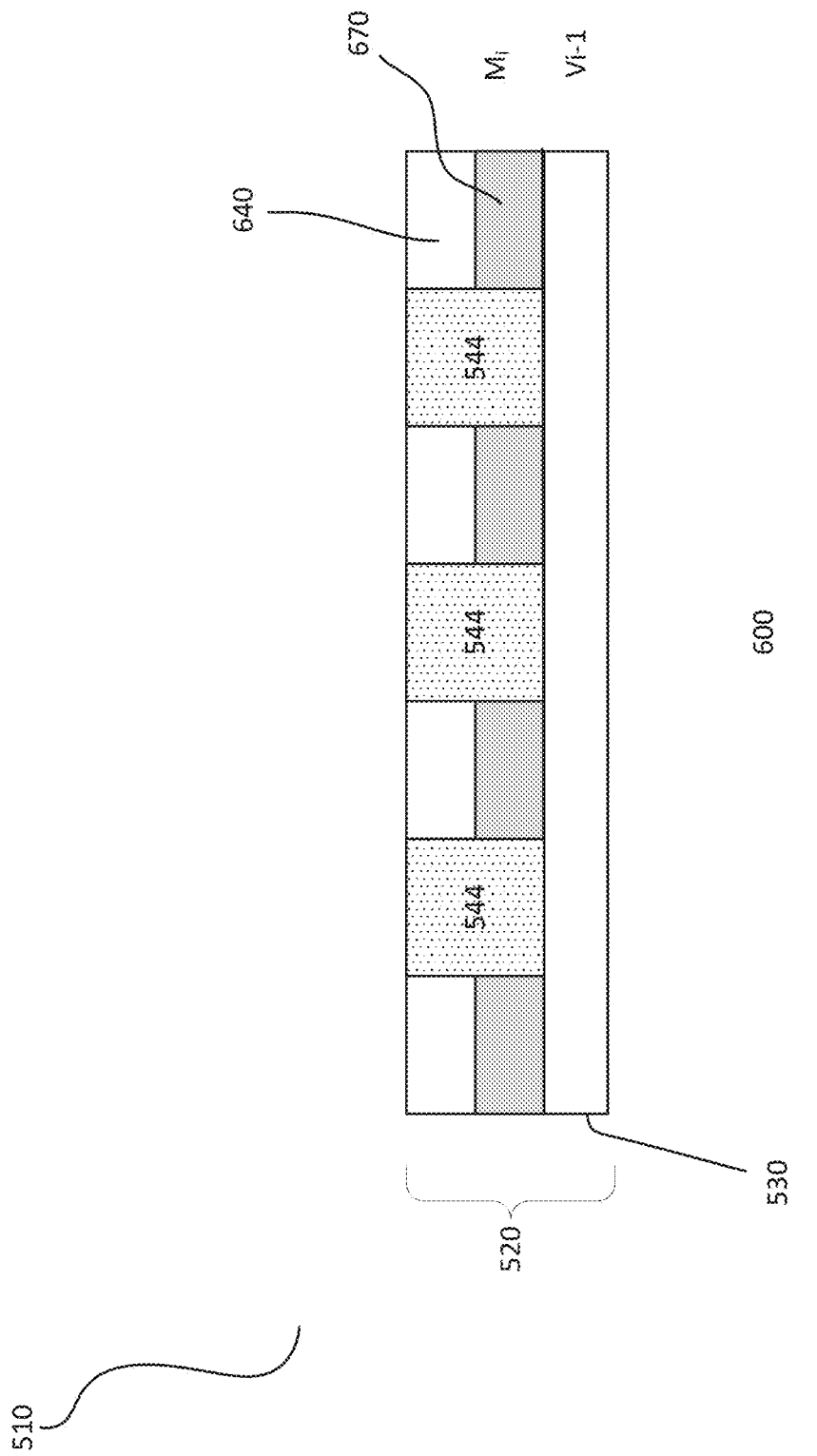

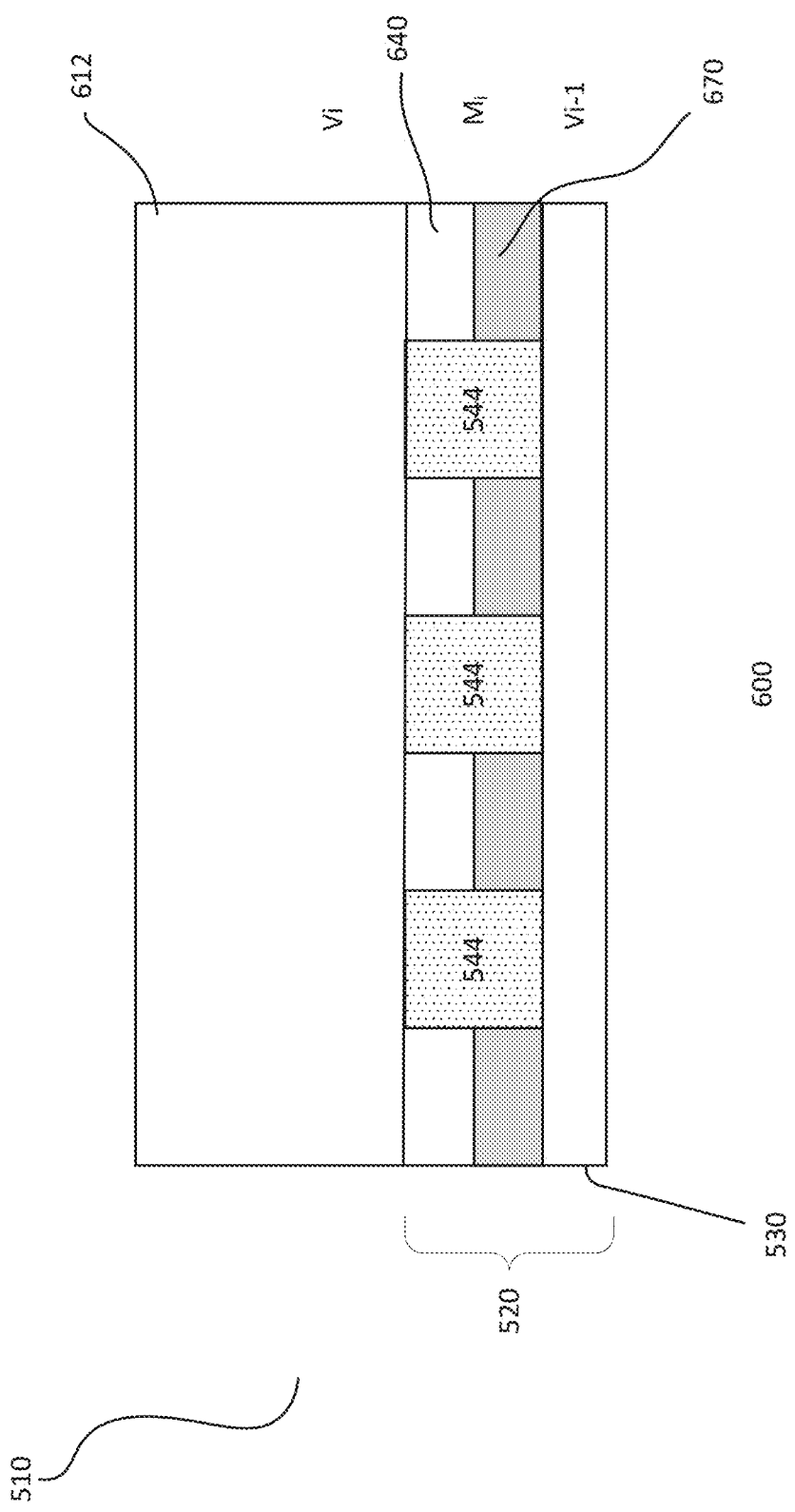

REDUCED CAPACITANCE COUPLING EFFECTS IN DEVICES

BACKGROUND

The advancement towards miniaturization of technological devices has driven modern semiconductor fabrication technology into the sub-nano features. As dimensions continue to decrease, new challenges are encountered. In particular, parasitic capacitance in transistors have increased, resulting in decreased performance. In addition, capacitance coupling between metal lines in back-end-of-line (BEOL) processing has similarly increased. Increased coupling capacitance reduces signal transmission speed as well as signal integrity.

The present disclosure is related to reducing parasitic capacitance in transistors as well as coupling capacitance in metal lines.

SUMMARY

Embodiments generally relate to semiconductor devices or integrated circuits (ICs) and methods for forming the devices.

One embodiment relates to a semiconductor device. The semiconductor device includes a substrate having at least a device region with circuit component formed on its surface. The circuit component includes having a gate positioned atop of the device region and includes a gate dielectric layer disposed on the substrate and a gate electrode disposed over the dielectric layer. A negative capacitance (NC) dielectric layer such as a ferroelectric layer is disposed at each side of the gate sidewalls and a source/drain (S/D) contact is positioned on a S/D disposed on the substrate adjacent to the gate.

Another embodiment relates to a semiconductor device. The semiconductor device includes a substrate having at least a device region with circuit component formed on its surface. The circuit component includes having a gate positioned atop of the device region and includes a gate dielectric layer disposed on the substrate and a gate electrode disposed over the dielectric layer. A spacer is disposed at each side of the gate sidewalls that includes a first spacer adjacent to and in contact with a gate region and a S/D region, as well as a second spacer adjacent and in contact with the first spacer. Either the first spacer or the second spacer may be a NC dielectric layer such as a ferroelectric layer. The device has a S/D contact that is positioned on a S/D disposed on the substrate adjacent to the gate.

Another embodiment relates to a semiconductor. The semiconductor device includes a substrate prepared with at least a circuit component and a plurality of interlevel dielectric (ILD) with interconnects. The ILD connecting to the circuit component has a plurality of metal lines that includes a NC dielectric layer followed by a dielectric layer disposed in-between the metal line. A next ILD is disposed over the dielectric layer and the metal line of the previous ILD and further includes a plurality of next layer of metal lines disposed over it.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6a-6g show a process for forming another embodiment of a device.

DETAILED DESCRIPTION

Embodiments generally relate to devices, for example, semiconductor devices or integrated circuits (ICs). More particularly, embodiments relate to forming ferroelectric sidewall spacers in metal oxide semiconductor field effect transistor (MOSFET) and ferroelectric layer in interlevel dielectric (IDL) in ICs. The ICs can be any type of ICs, such as dynamic or static random access memories, signal processors, microcontrollers or system-on-chip (SoC) devices. Other types of devices may also be useful. The devices or ICs can be incorporated into or used with, for example, consumer electronic products, or other types of products.

The fabrication of devices may involve the formation of features on a substrate that make up circuit components, such as transistors, resistors and capacitors. The devices are interconnected, enabling the IC to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1:
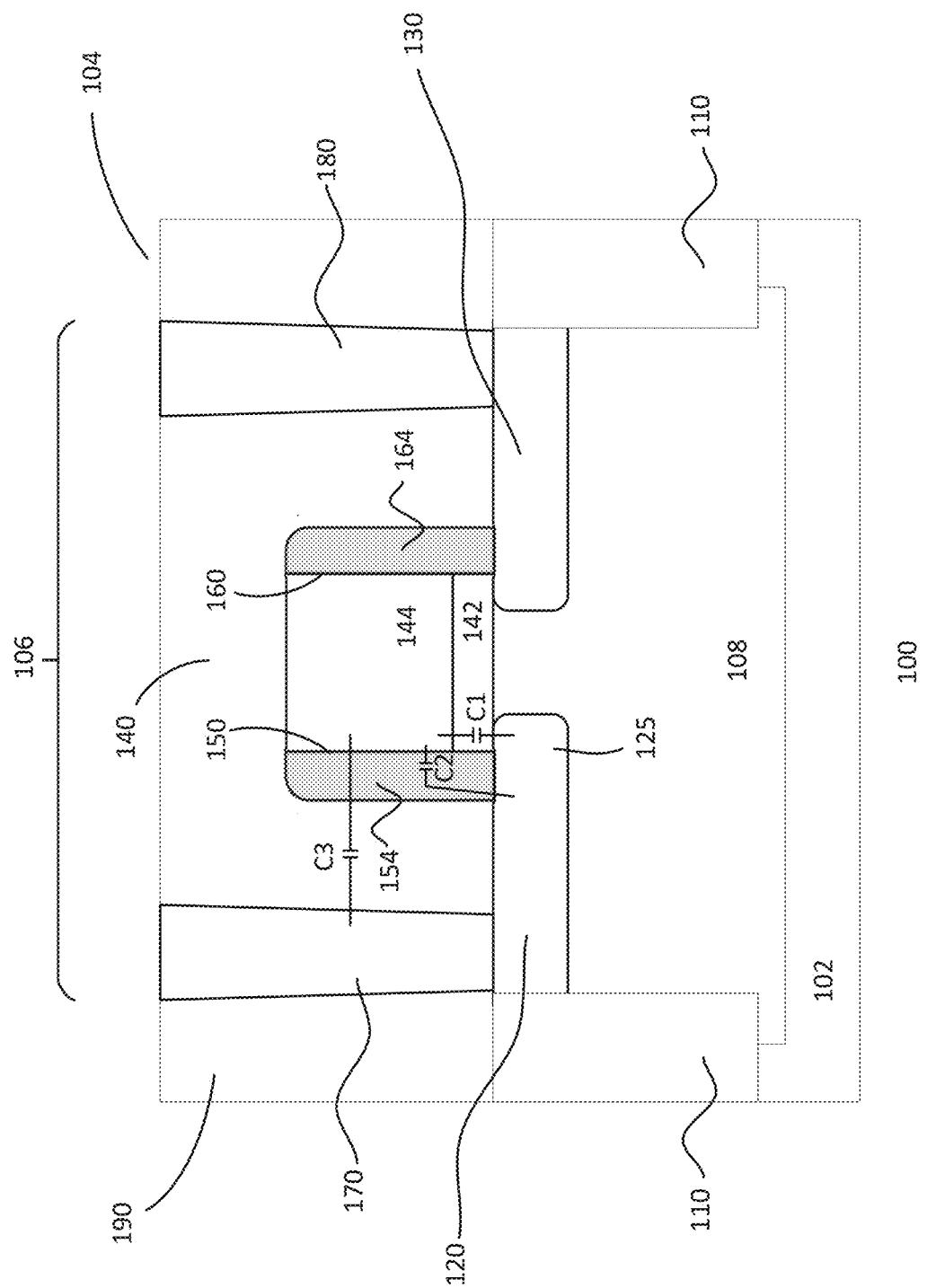
FIG. 1 shows a cross-sectional view of an embodiment of a semiconductor device.

FIG. 1 shows a simplified cross-sectional view of an embodiment of a semiconductor device 100. As shown, the device includes a substrate 102. The substrate, for example, is a semiconductor substrate, such as a silicon substrate. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The substrate, as shown, includes a device region 106. The device region is a device region for a transistor 140. The transistor may be a logic or low voltage (LV) transistor. For example, the device region LV device region. Providing other types of transistors may also be useful. For example, the device region may be other types of device regions for other types of transistors, such as a high voltage (HV) region for HV transistor or an intermediate or medium voltage (MV) region for a MV transistor. It is understood that a device may include numerous types of device regions, as discussed. In addition, other types of device regions, such as memory device regions, may also be included.

The device may include doped regions having different dopant concentrations. For example, the device may include heavily doped ($x^+$), intermediately doped (x) and lightly doped (x) regions, where x is the polarity type which can be p or n. A lightly doped region may have a dopant concentration of about $1E11$-$1E13/cm^3$, and an intermediately doped region may have a dopant concentration of about $1E13$-$E15/cm^3$, and a heavily doped region may have a dopant concentration of about $1E15$-$1E17/cm^3$. Providing other dopant concentrations for the different types of doped regions may also be useful. For example, the ranges may be varied, depending on the technology node. P-type dopants may include boron (B), aluminum (Al), indium (In) or a combination thereof, while n-type dopants may include phosphorous (P), arsenic (As), antimony (Sb) or a combination thereof.

Isolation regions may be provided for isolating or separating different regions of the substrate. In one embodiment, the device region is isolated from other regions by a device isolation region 110. For example, the device isolation region surrounds the device region. Other configurations of isolation regions may also be useful. The isolation region, for example, is a shallow trench isolation (STI) region. Other types of isolation regions may also be employed. In some embodiments, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful.

A device well 108 may be disposed in the device region 106. As shown, the device well is disposed in the device region and extends below the isolation region 110. To ensure that the device well completely occupies the device region, it may overlap the bottom of the isolation region. Other configurations of the device well may also be useful. The device well is formed of a second polarity type dopant and serve as a body for a first polarity type transistor. For example, the device well is a p-type device well for a n-type transistor A gate 140 of transistor 106 is disposed on the substrate over the device well in the device region. The gate, for example, includes a gate dielectric layer 142, such as thermal silicon oxide, with a gate electrode layer 144, such as polysilicon, over it. The gate electrode may be a doped gate electrode. The thickness of the gate dielectric may be about 15-100 Å and the thickness of the gate electrode may be about 1000-3000 Å. Other thicknesses may also be useful. The thicknesses may depend on design requirements. The gate may be a gate conductor which serves as a common gate for other transistors. Other configurations of the gate may also be useful.

The gate includes first and second gate sidewalls 150 and 160. First and second dielectric sidewall spacers 154 and 164 are disposed on the first and second gate sidewalls. For example, the first dielectric sidewall spacer is disposed on the first gate sidewall and the second dielectric sidewall spacer is disposed on the second gate sidewall.

First and second source/drain (S/D) regions 120 and 130 are disposed in the substrate in the device region adjacent to the gate. For example, the first S/D region is disposed in the substrate adjacent to the first gate sidewall and the second S/D region is disposed in the substrate adjacent to the second gate sidewall. The S/D regions are heavily doped first polarity type regions. For example, the S/D regions are n-type for a n-type transistor.

A S/D region may include a lightly doped extension (LDE) region 125. For example, a S/D region includes a heavily doped portion and a lightly doped portion. In the case a S/D region includes a LDE region, the heavily doped S/D region may be between the device isolation region to about an edge of a sidewall spacers while the LDE region extends underneath the gate, overlap the gate. The LDE region, as shown, has the same depth as the heavily doped regions. Providing LDE region which is shallower than the heavily doped portion may also be useful.

Metal silicide contacts (not shown) may be formed on the gate and S/D regions. The metal silicide contacts, for example, may be nickel-based contacts. Other types of metal silicide contacts may also be useful. For example, the metal silicide contact may be cobalt silicide (CoSi) or nickel silicide (NiSi). The metal silicide contacts may be about 50-300 Å thick. Other thickness of metal silicide contacts may also be useful. The metal silicide contacts may be employed to reduce contact resistance and facilitate contact to the back-end-of-line (BEOL) metal interconnects.

A dielectric layer 190, as shown, is disposed over the substrate, covering the transistor. The dielectric layer, for example, is a silicon oxide layer. Other types of dielectric layers may also be useful. For example, the dielectric layer may be a low k dielectric layer. The dielectric layer, for example, serves as a pre-metal dielectric (PMD) layer. The PMD layer, for example, is the first layer of BEOL processing.

Contacts are disposed in the PMD layer. The PMD layer may be referred to as a CA or first contact level. As shown, first and second contacts 170 and 180 are provided in the PMD layer which are electrically coupled to the first and second S/D regions. In addition, a gate contact (not shown) may be provided in the PMD layer which is electrically coupled to the gate. For example, the gate contact may be provided in a different cross-section of the device. The contacts in the PMD layer may be tungsten contacts. Other types of contacts may also be useful.

A metal level (not shown) is provided over the PMD layer. The metal level may be referred to as the first metal level ($M_1$). The first metal level includes metal lines, such as copper or copper alloy lines. Other types of metal lines may also be provided. Generally, the contacts and metal lines in CA and $M_1$ are formed by damascene techniques. Forming contacts and metal lines in CA and $M_1$ by other techniques may also be useful.

Additional contact and metal levels may also be formed over the first metal level. The additional contact levels and metal levels may be referred to as interlevel dielectric (ILD) layers of levels. Generally, a device includes numerous ILD levels. For example, a device may include up to 6 ILD levels. Providing other number of ILD levels may also be useful. Contacts and metal lines may be formed by dual damascene techniques in the additional ILD levels. In the case of dual damascene techniques, metal lines and contacts are formed of the same material, such as copper or copper alloy. Other configurations of contacts and metal lines may also be useful. For example, additional ILD levels may be formed using damascene techniques or a combination of damascene and dual damascene techniques.

As illustrated, the transistor has various overlap parasitic capacitances C1, C2 and C3. The total overlap capacitance $C_{ov}$ can be defined as follows:

$$C_{ov}=C1+C2+C3,$$

where
C1=capacitance of the gate oxide $C_{ox}$,
C2=capacitance of the spacer $C_{sp}$, and
C3=capacitance of the contact and gate electrode $C_{PC\text{-}CA}$.

In one embodiment, $C_{ov}$ is reduced by providing sidewall spacers on the first and second gate sidewalls which have negative capacitance. For example, sidewall spacers have materials which produce negative capacitance. By providing negative capacitance for C2, $C_{ov}$ is reduced. In one embodiment, $C_{ov}$ with a negative C2 is as follows:

$$C_{ov}=C1+(-C2)+C3.$$

In one embodiment, $C_{ov}$ is a positive number. For example, $C_{ov}=C1+(-C2)+C3$, where $C_{ov}>0$. Providing a positive $C_{ov}$ results in stable operation for the transistor. In one embodiment, C2 is configured to be equal to about C1 ($C_{ox}$). In such case, $C_{ov}$ is equal to about C3. In conventional applications in which C2 is positive, C3 is about 10% of $C_{ov}$. However, with the use of negative capacitance of C2, 90% reduction in $C_{ov}$ can be achieved since C1 and C2 are cancelled out of the equation for $C_{ov}$. In other embodiments, C2<C1, then up to 90% reduction in $C_{ov}$ can be achieved.

Reducing $C_{ov}$ results in reduced gate to drain coupling, lowering gate induced drain leakage (GIDL). Furthermore, $C_{ov}$ contributes about 40% of the total $C_{eff}$ of ringo. As such, a 90% reduction in $C_{ov}$ will result in about 36% lower $C_{eff}$. A lower $C_{eff}$ reduces the ringo delay, improving transistor performance.

In one embodiment, the first and second spacers 154 and 164 include ferroelectric spacers to produce negative capacitance for C2. The ferroelectric spacers may hafnium-zirconium-oxide (HZO) spacers, such as $HfZrO_2$. Other types of ferroelectric spacers may also be useful. For example, ferroelectric materials such as lead-zirconium-titanate (PZT), such as $PbZrTiO_3$, or barium-titanate-oxide (BTO), such as $BaTiO_3$, may also be useful. Other types of ferroelectric materials or negative capacitance materials may also be useful to form the spacers.

In one embodiment, to stabilize the hysteresis of the ferroelectric spacers, a thin oxide layer is disposed between the spacers and the gate sidewalls as well as on the surface of the substrate. For example, the gate and substrate may be oxidized prior to forming ferroelectric spacers. The oxide layer, for example, is about 10-30 Å thick. The exposed oxide is then removed when spacers are formed to expose the S/D regions.

The thickness of the spacer can be designed or selected to produce negative capacitance. In one embodiment, the thickness of the spacer is selected to produce a negative capacitance having a magnitude equal to about C2 ($C_{ox}$). For example, this results in C1 and C2 cancelling each other out. In other embodiment, the magnitude of the negative capacitance of C2 is less than or equal to C1.

The spacers may be formed by forming a spacer layer over the substrate, covering the transistor. The spacer layer, for example, may be formed by chemical vapor deposition (CVD). Other techniques for forming the spacer layer may also be useful. The thickness of the spacer layer is selected to produce the desired negative capacitance. An anisotropic etch, such as reactive ion etch (RIE), is performed to remove horizontal portions of the spacer layer, leaving spacers on sidewalls of the gate. Other techniques for forming the spacers may also be useful.

Figure 2:
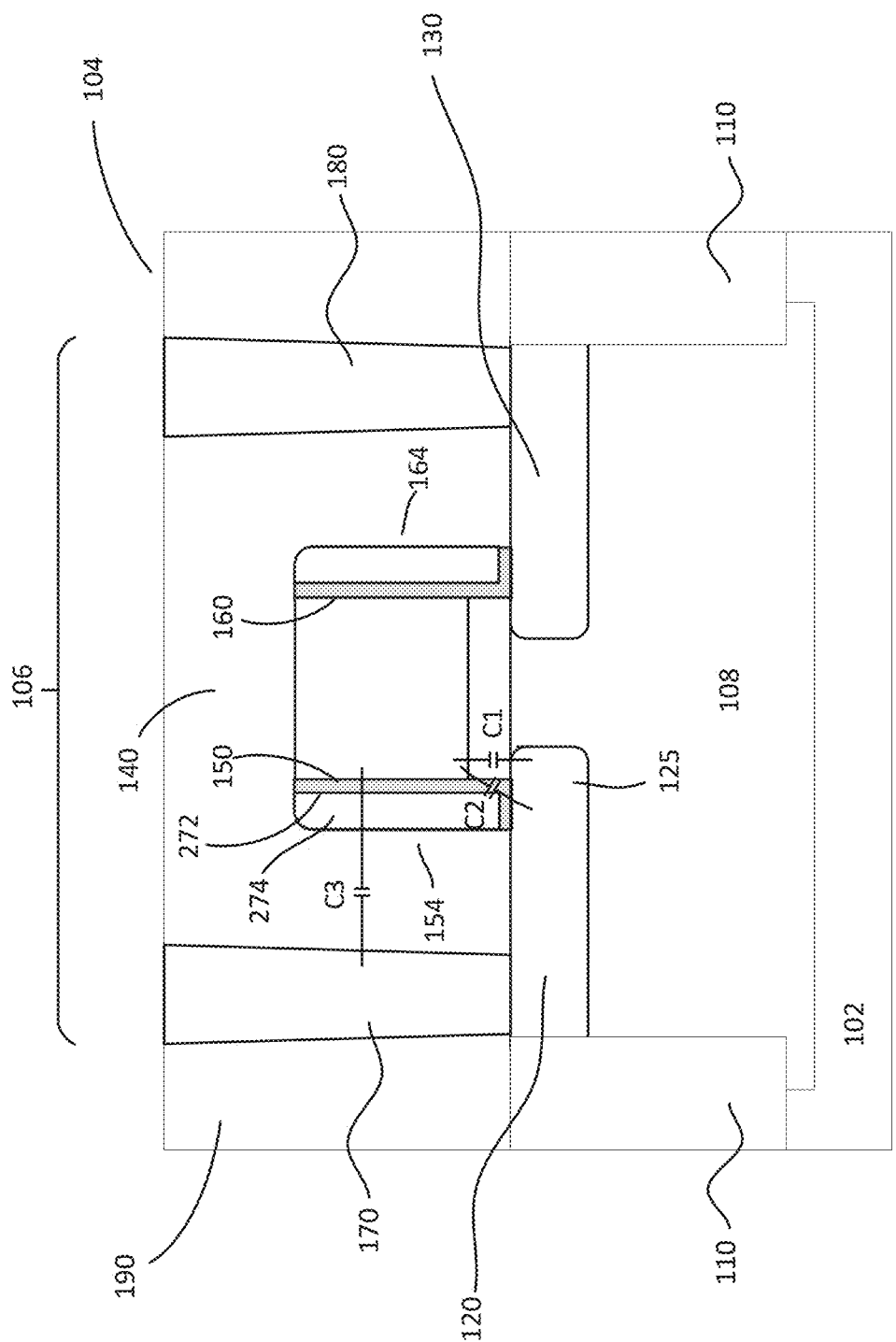
FIG. 2 shows a cross-sectional view of an alternative embodiment of a semiconductor device.

FIG. 2 shows a simplified cross-sectional view of another embodiment of a device 200. The device is similar to device 100 of FIG. 1. Common elements may not be described or described in detail. As shown, the sidewalls 150 and 160 of the gate of transistor 140 includes first and second spacers 154 and 164. The spacers, for example, are spacer stacks having multiple layers. In one embodiment, a spacer includes a spacer liner layer 272 lining the gate and a spacer 274 disposed on the spacer liner. The spacer liner, for example, is a L-shaped liner disposed between the spacer and gate sidewalls.

In one embodiment, the spacer liner is a negative capacitance spacer liner and the spacer is a dielectric spacer. The dielectric spacer, for example, may be a silicon oxide spacer. Other types of dielectric spacers, such as silicon nitride, may also be useful. As for the negative capacitance spacer liner, in one embodiment, is a ferroelectric spacer liner. For example, the spacer liner may be hafnium-zirconium-oxide (HZO) spacer liner, such as $HfZrO_2$. Other types of ferroelectric spacer liners may also be useful. For example, ferroelectric materials such as lead-zirconium-titanate (PZT), such as $PbZrTiO_3$, or barium-titanate-oxide (BTO), such as $BaTiO_3$, may also be used to serve as the spacer liner. Other types of ferroelectric materials or negative capacitance materials may also be useful to form the spacer liner.

In one embodiment, to stabilize the hysteresis of the ferroelectric spacer liners, a thin oxide layer is disposed between the spacer liners and the gate sidewalls as well as on the surface of the substrate. For example, the gate and substrate may be oxidized prior to forming ferroelectric spacers. The oxide layer, for example, is about 10-30 Å thick. The exposed oxide is then removed when spacer liners are formed to expose the S/D regions.

As shown, the total overlap capacitance $C_{ov}$ of the transistor can be defined as follows:

$$C_{ov}=C1+C2+C3,$$

where
C1=capacitance of the gate oxide $C_{ox}$,
C2=capacitance of the spacer liner $C_{sp1}$, and
C3=capacitance of the contact and gate electrode $C_{PC\text{-}CA}$.

The thickness of the spacer liners can be designed or selected to produce negative capacitance. In one embodiment, the thickness of the spacer liners is selected to produce a negative capacitance having a magnitude equal to about C2 ($C_{ox}$). For example, this results in C1 and C2 cancelling each other out. In other embodiment, the magnitude of the negative capacitance of C2 is less than or equal to C1.

The spacer stack may be formed by forming a spacer liner layer over the substrate, covering the transistor. The spacer liner layer, for example, may be formed by chemical vapor deposition (CVD). Other techniques for forming the spacer liner layer may also be useful. The thickness of the spacer liner layer is selected to produce the desired negative capacitance. A spacer layer is subsequently formed over the spacer liner layer. The spacer layer, for example, may be a silicon oxide layer. Other types of spacer layer, such as a silicon nitride layer, may also be useful. The thickness of the spacer layer may be about 200-500 Å. For example, the thickness is selected to produce a desired overall spacer stack thickness. An anisotropic etch, such as reactive ion etch (RIE), is performed to remove horizontal portions of the spacer liner and spacer layers, leaving spacer stacks on sidewalls of the gate. Other techniques for forming the spacer stacks may also be useful.

Figure 3:
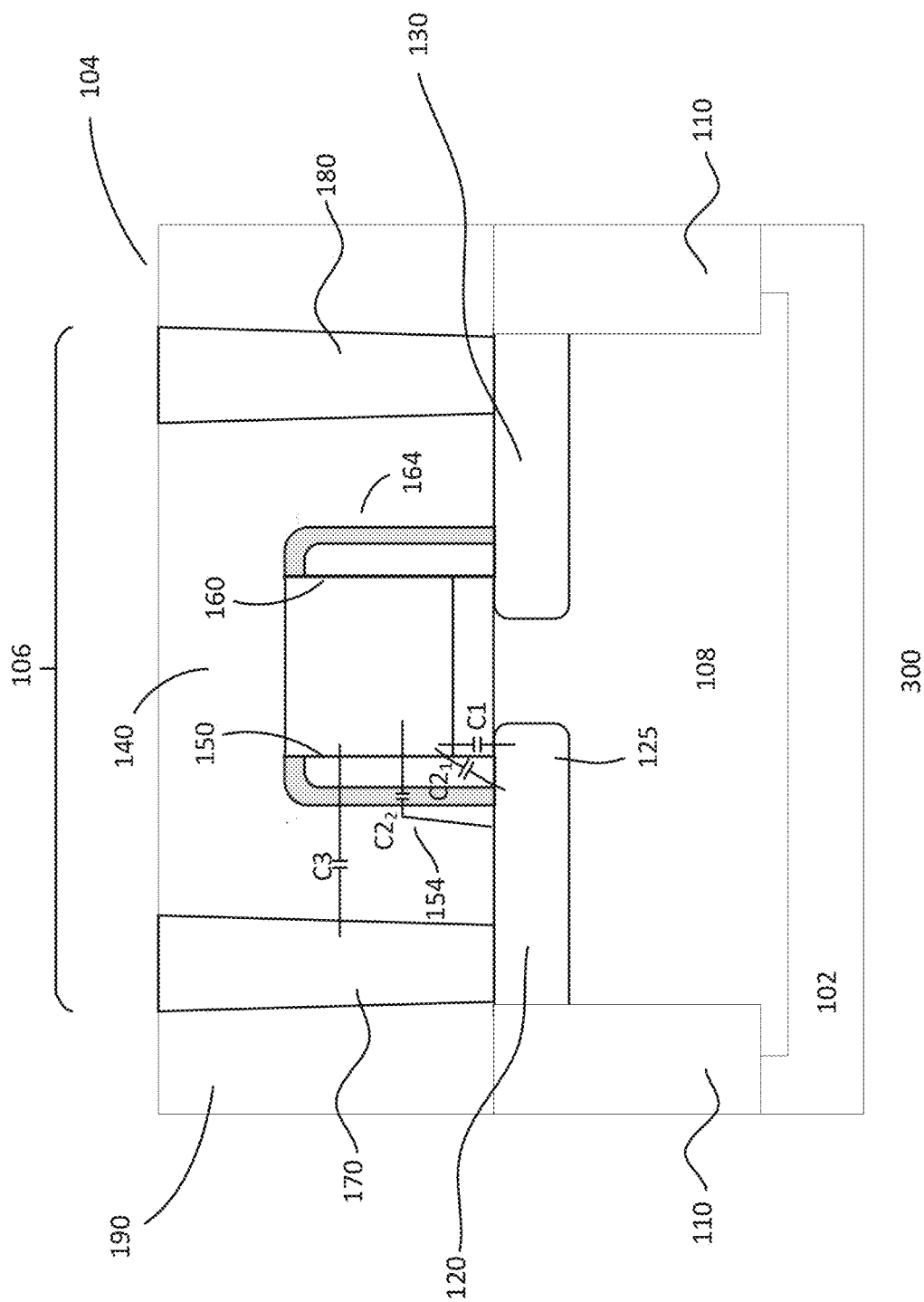
FIG. 3 shows a cross-sectional view of another embodiment of a semiconductor device.

FIG. 3 shows a simplified cross-sectional view of yet another embodiment of a device 300. The device is similar to devices of FIGS. 1-2. Common elements may not be described or described in detail. As shown, the sidewalls 150 and 160 of the gate of transistor 140 includes first and second spacers 154 and 164. The spacers, for example, are spacer stacks having multiple layers. In one embodiment, a spacer includes first and second spacers 372 and 374. The first spacer 372 lines a gate sidewall while the second spacer is disposed over the first spacer. As shown, the first spacer has a first spacer top which is below a top of the gate while the second spacer has a second spacer top which is equal to about the top of the gate.

In one embodiment, the first spacer is a dielectric spacer, such as a silicon oxide spacer. Other types of dielectric spacers, such as silicon nitride, may also be useful. As for the second spacer, it is a negative capacitance second spacer. The negative capacitance spacer, in one embodiment, is a ferroelectric spacer liner. For example, the second spacer may be a hafnium-zirconium-oxide (HZO) spacer, such as $HfZrO_2$. Other types of ferroelectric second spacers may also be useful. For example, ferroelectric materials such as lead-zirconium-titanate (PZT), such as $PbZrTiO_3$, or barium-titanate-oxide (BTO), such as $BaTiO_3$, may also be used to serve as the second spacer. Other types of ferroelectric materials or negative capacitance materials may also be useful to form the second spacer.

In one embodiment, to stabilize the hysteresis of the ferroelectric spacer liners, a thin oxide layer is disposed between the spacer liners and the gate sidewalls as well as on the surface of the substrate. For example, the gate and substrate may be oxidized prior to forming ferroelectric spacers. The oxide layer, for example, is about 10-30 Å thick. The exposed oxide is then removed when spacer liners are formed to expose the S/D regions.

As shown, the total overlap capacitance $C_{ov}$ of the transistor can be defined as follows:

$$C_{ov} = C1 + C2_1 + C2_2 + C3,$$

where

C1=capacitance of the gate oxide $C_{ox}$,
$C2_1$=capacitance of the first spacer $C_{sp1}$,
$C2_2$=capacitance of second spacer $C_{sp2}$, and
C3=capacitance of the contact and gate electrode $C_{PC-CA}$.

The thickness of the second spacer can be designed or selected to produce negative capacitance. In one embodiment, the thickness of the second spacer is selected to produce a negative capacitance having a magnitude equal to about C2 ($C_{ox}$). For example, this results in C1 and $C2_2$ cancelling each other out. In other embodiment, the magnitude of the negative capacitance of $C2_2$ is less than or equal to C1. With proper adjustment of thickness of the second spacer, $C2_2$ may also be able to cancel C1 and $C2_1$.

The spacer stack may be formed by forming a first spacer layer over the substrate, covering the transistor. The first spacer layer, for example, may be formed by chemical vapor deposition (CVD). Other techniques for forming the first spacer layer may also be useful. The first spacer layer, for example, may be a silicon oxide layer. Other types of spacer layer, such as a silicon nitride layer, may also be useful. An anisotropic etch, such as reactive ion etch (RIE), is performed to remove horizontal portions of the first spacer layer, leaving first spacers on sidewalls of the gate. In one embodiment, an overetch is performed to form first spacers having a first spacer top surface below the top surface of the gate. A second spacer layer is subsequently formed on the substrate, covering the gate with the first spacers. The thickness of the second spacer layer is selected to produce the desired negative capacitance. For example, the thickness is selected to produce a desired overall spacer stack thickness with the desired negative capacitance. An anisotropic etch, such as reactive ion etch (RIE), is performed to remove horizontal portions of the second spacer layer, leaving second spacers over the first spacers. Other techniques for forming the spacer stacks may also be useful.

Figure 4:
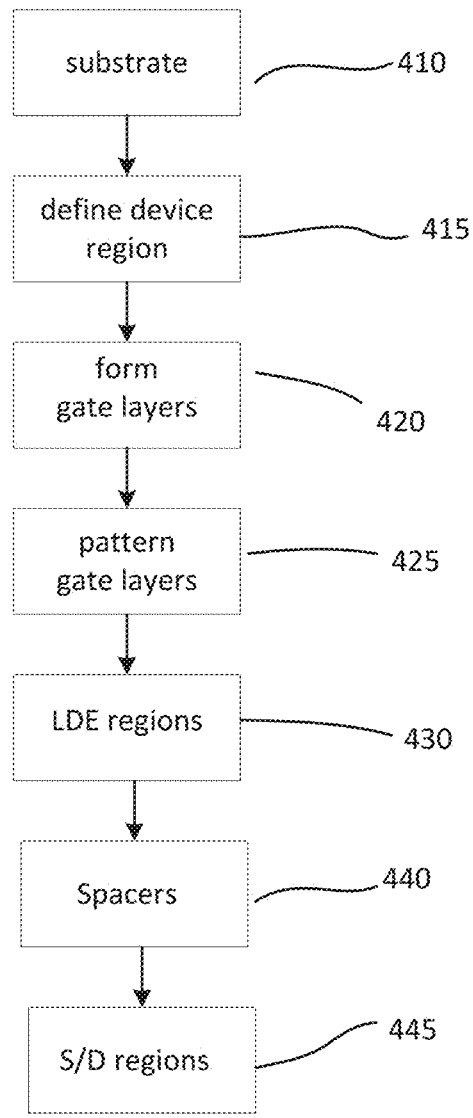
FIG. 4 illustrates a process for forming an embodiment of a device.

FIG. 4 shows a process flow 400 for forming an embodiment of a device. At step 410, a substrate is provided. The substrate, in one embodiment, is a silicon substrate. The substrate may be a doped substrate, such as a $p^-$ substrate. Other types of substrates, such as a germanium-based, gallium arsenide, COI such as SOI, or sapphire, may also be useful. The substrates may be doped with other types of dopants or dopant concentrations.

The substrate is defined with a device region at step 415. The device region, for example, is for a transistor. The transistor may be a logic transistor, such as a low voltage (LV) transistor. For example, the device region is a LV device region. Other device regions may also be included in the substrate. For example, the device may include regions for high voltage (HV) devices and medium or intermediate voltage (IV) transistors. Additionally, other types of device regions may also be provided, such as, for example, memory devices as and/or radio frequency (RF) devices.

In one embodiment, defining the device region includes forming an isolation region. The isolation region is, for example, an STI region. An STI region, for example, surrounds the device region. As discussed, the device may include number types of device regions isolated by STI regions. Various processes can be employed to form the STI region. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 3000-5000 Å. Other depths for the STIs may also be useful. In other embodiments, the isolation may be other types of isolation regions.

A doped well may be formed in the device region. In one embodiment, a doped well of second polarity type is formed in the device region. The doped well, for example, may extend below the STI. The doped well may be formed by implanting appropriate dopants with the desired dose and power into the substrate. For example, a well implant mask which exposes the device region may be used for the implant. The implant mask, for example, may include a photoresist patterned by a lithographic mask. Since the device isolation region can serve as an implant mask, this allows for increased processing window for the patterning process to form the implant mask. The implant mask may be removed after the deep well is formed. Other techniques for forming the deep device well may also be useful. An anneal may be performed to diffuse the dopants, forming a doped well which extends to under the bottom of the STI. Other implants may be performed to form other doped wells using separate implant processes. For example, different implant masks may be used for different implant processes.

After defining the device region, gate layers of a gate are formed on the substrate at step 420. In one embodiment, the gate layers include a gate dielectric layer on the substrate and a gate electrode layer thereon. The gate dielectric layer, for example, is silicon oxide. Other types of gate dielectric, for example, high voltage gate dielectric, may also be useful. The gate dielectric layer may be formed by thermal oxidation. Forming other types of gate dielectric layers or using other processes may also be useful.

In one embodiment, the gate electrode layer is a silicon layer. The silicon layer, for example, may be a polysilicon layer. The gate electrode layer may be formed by, for example, CVD. Other techniques for forming the gate electrode layer may also be useful. The gate electrode layer can be formed as an amorphous or non-amorphous layer. In the case of an amorphous layer, an anneal may be performed to form a polycrystalline silicon layer.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

At step 425, the gate layers are pattern to form a gate over the device region. To pattern the gate layers, a mask layer may be formed on the substrate. The mask layer, for example, is formed over the gate electrode layer. In one embodiment, the mask layer is a soft mask layer, such as a photoresist layer. An exposure source may selectively expose the photoresist layer through a reticle containing the desired pattern. After selectively exposing the photoresist layer, it is developed to form openings corresponding to locations when the gate layers are to be removed. To improve lithographic resolution, an anti-reflective coating (ARC) may be used below the photoresist layer.

The patterned mask layer serves as an etch mask for a subsequent etch process. For example, the etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful. In one embodiment, an RIE is employed to pattern the gate layers to form the gate. The gate may be a gate conductor, serving as a common gate for multiple transistors. Other configurations of the gate may also be useful.

At step 430, in one embodiment, LDE regions are formed in the substrate in the device region adjacent to the gate. The LDE regions include first polarity type dopants. To form the lightly doped region, first polarity type dopants are implanted into the substrate using, for example, an implant mask. The depth of the LDE regions, for example, is about 0.1-0.4 μm. The implant dose may be about $5E12$-$5E13/cm^2$ and the implant energy may be about 10-100 KeV. Other implant parameters may also be useful. The implant mask may be a photoresist layer. Other types of implant masks may also be useful.

Sidewall spacers are formed at step 440. As discussed in FIGS. 1-3, the sidewall spacers produce negative capacitances. For example, the sidewall spacers may be negative capacitance spacers or a combination of negative capacitance layers and non-negative capacitance layers, such as a spacer stack.

After forming the spacers, S/D regions are formed in the substrate adjacent to the gate at step 445. For example, heavily doped regions serving as the heavily doped S/D regions are formed. The heavily doped regions have first polarity type dopants. Forming the heavily doped regions includes implanting first polarity type dopants using an implant mask. The implant mask may be formed using the same reticle as the one forming the one used for forming the LDE regions. The sidewall spacers cause the heavily doped source region to be offset, creating a source which includes a lightly doped source portion and a heavily doped deeper portion. The depth of the heavily doped regions, for example, is about 0.1-0.4 μm. The implant dose may be about $1E15$-$1E16/cm^2$ and the implant energy may be about 10-100 KeV. Other implant parameters may also be useful.

In one embodiment, metal silicide contacts 128 are formed on contact regions of the transistor. For example, the metal silicide contacts are formed on the gate and source and drain of the transistor. The silicide contacts are to facilitate low resistance contacts between the active substrate and the BEOL metal lines. In one embodiment, the thickness of the metal silicide contacts is about 50-300 Å. Providing other thicknesses may also be useful.

To form the metal silicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by physical vapor deposition (PVD). Other types of metal elements and/or be formed by other types of processes can also be useful.

A first anneal may be performed. The first anneal diffuses the metal dopants into the active substrate, forming a silicided layer. The first anneal, for example, is performed at a temperature of about 500° C. for about 30 seconds. Excess metal not used in the silicidation of the active surface is removed by, for example, a wet removal process. For example, unreacted metal material is removed selective to the metal silicide contacts. A second anneal may be performed to enhance the material properties of the silicided layer, for example, lower resistivity. The first and second annealing processes may be a rapid thermal anneal (RTA). Other annealing parameters or techniques may also be useful to form the metal silicide contacts.

The process continues to form the device. The process may include forming a PMD layer and contacts to the terminals of the transistor as well as metal and additional ILD levels, final passivation, dicing, assembly and packaging. Other processes may also be included. For example, other components, such as low voltage, medium voltage, and high voltage I/O devices can be formed prior to forming the interconnections.

Figure 5:
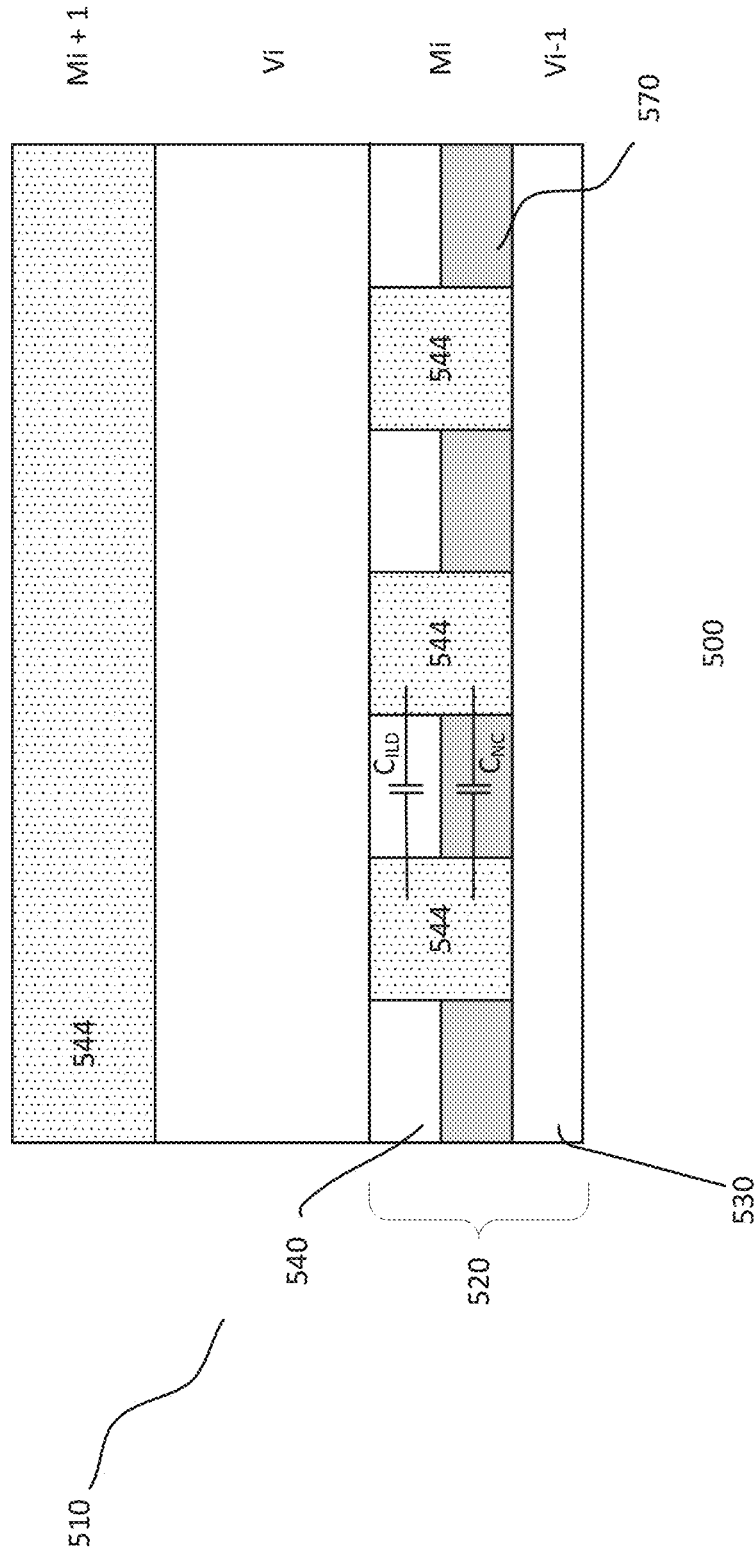
FIG. 5 shows cross-sectional view of another embodiment of a device.

FIG. 5 shows a simplified embodiment of a device 500. The device, for example, is an integrated circuit (IC). Other types of devices may also be useful. The device, for example, may be formed in parallel on a wafer and subsequently singulated. The device includes a substrate (not shown). The substrate, for example, may be part of the wafer, such as a silicon wafer. Other types of substrates or wafers may also be useful. The substrate of the device may include various types of regions. Such regions, for example, may include high voltage (HV), low voltage (LV) and intermediate or medium voltage (MV) regions. High voltage devices or components are formed in the high voltage region, low voltage components are formed in the low voltage region and intermediate voltage components are formed in the intermediate voltage region. The components, for example, are metal oxide semiconductor (MOS) transistors. Other types of components or device regions may also be useful.

Front-end-of-line (FEOL) processing may be performed on the substrate. For example, isolation regions are formed to isolate different device regions. The isolation regions, for example, are shallow trench isolation (STI) regions. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, gate oxide layer, such as thermal silicon oxide, followed by a gate electrode layer, such as polysilicon. The gate electrode may be doped. Other types of gate materials may also be useful. Separate processes may be performed for forming gate dielectrics of the different voltage transistors. This is due to, for example, different gate oxide thicknesses associated with the different voltage transistors. For example, a HV transistor will have a thicker gate dielectric than a LV transistor.

The gate layers, in one embodiment, may be formed on the active surface of the substrate. After the gate layers are formed on the active surface of the substrate, they are patterned to form gates. For example, a photoresist mask may be used for a reactive ion etch (RIE) to pattern the gate layers to form the gates. Source/drain (S/D) regions are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist mask.

After forming transistors, back-end-of-line (BEOL) processing is performed. The BEOL process includes forming interconnects in a backend dielectric layer. The interconnects connect the various components of the IC to perform the desired functions. The backend dielectric layer may include a plurality of interlevel dielectric layers or levels 520. An ILD layer includes a metal level 540 and a contact level 520. The metal level includes conductors or metal lines 544 while the contact level includes contacts (not shown). The conductors and contacts may be formed of metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene techniques. This results in the conductors and contacts having the same material. In some cases, the conductors and contacts may have different materials. Forming the upper metal levels using single damascene techniques may also be useful. For example, in the case where the contacts and conductors are formed by single damascene techniques, the materials of the conductors and contacts may be different. Other techniques, such as reactive ion etch (RIE) may also be employed to form metal lines.

As discussed, a device may include a plurality of ILD layers or levels. For example, x number of ILD levels may be provided. For example, 5 ILD levels (x=5) may be provided for the device. Other number of ILD levels may also be useful. The number of ILD levels may depend on, for example, design requirements or the logic processes involved. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level, it may be referred to as CA.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). Other types of dielectric materials, such as low-k dielectrics may also be useful. The dielectric layer serves as a pre-metal dielectric layer or the first contact layer of the BEOL process. The dielectric layer may be referred to as the CA level of the BEOL process. Contacts are formed in the CA level dielectric layer. The contacts may be formed by single damascene techniques. Via openings are formed in the dielectric layer using mask and etch techniques. For example, a pattern resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical planarization (CMP), is performed to remove excess conductive material, leaving contact plugs in the CA level.

After forming contacts in the CA level, the BEOL process continues to form a dielectric layer over the substrate, covering the CA level dielectric layer. The dielectric layer, for example, serves as the first metal level $M_1$ of the first ILD layer. The dielectric layer, for example, is a silicon oxide layer. Other types of dielectric layers, such as low-k dielectrics, may also be useful. The dielectric layer may be formed by CVD. Other techniques for forming the dielectric layer may also be useful.

Conductive lines are formed in the $M_1$ level dielectric layer. The conductive lines may be formed by single or dual damascene techniques. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electro-less plating. Other types of conductive layers or forming techniques may also be useful. The first metal level $M_1$ and CA may be referred as a lower ILD level.

The process continues to form additional ILD layers. For example, the process continues to form upper ILD levels. The upper ILD levels may include ILD level 2 to ILD level x. For example, in the case where x=5 (5 levels), the upper levels include ILD levels from 2 to 5, which includes $M_2$ to $M_5$. The number of ILD layers depends on, for example, design requirements or the logic process involved. These ILD layers may be referred to as intermediate ILD layers. The intermediate ILD layers may be formed of silicon oxide. For example, the ILD layers may be TEOS ILD layers. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductors and contacts in the intermediate ILD layer. In other embodiments, the upper ILD layers may be formed by single damascene techniques. For example, in single damascene techniques, separate etch and fill processes are employed for the via and metal levels. Forming the upper ILD layers using a combination of single and dual damascene techniques may also be useful. For example, one or more upper levels may be formed by single damascene techniques while others are formed by dual damascene techniques.

A dielectric liner may be disposed between ILD levels, on the substrate. In some embodiments, a dielectric liner (not shown) may be disposed between a metal and a via level. The dielectric liner, for example, serves as an etch stop layer. The thickness of the dielectric liners may be about 200 Å. Other thicknesses may also be useful. The dielectric liners may be formed of a low k dielectric material. For example, the dielectric liners may be nBLOK. Other types of dielectric materials for the dielectric liners may also be useful. It is understood that different dielectric liners need not to be formed of the same material.

The uppermost ILD level (e.g., x) may have different design rules, such as critical dimension (CD), than the lower ILD levels. For example, the top metal level $M_x$ may have a larger CD than the lower metal levels $M_1$ to $M_{x-1}$. For example, the uppermost or top metal level may have a CD which may be greater than 6× compared to the lower levels. The lower levels may be 1×, 2× or 6×. Other configurations of the lower levels may also be useful.

In addition, a pad level (not shown) may be provided over $M_x$. The pad level is an ultra-thick metal (UTM) level. For example, pad interconnects are formed in the pad level to provide external connection to the device. A passivation layer (not shown) may be provided over the pad level. The passivation layer, for example serves to protect the device from cracking, oxidation, moisture as well as downstream processes. Other configurations of primary passivation layers may also be useful.

As shown, a portion of a BEOL dielectric 510 is shown. The portion includes an ILD level 520$i$ which includes a via level 530 and a metal level 540. For example, the ILD level is the $i^{th}$ level of the BEOL dielectric having x ILD levels. It is understood that the $i^{th}$ metal level can be any of the x metal levels in the device. The metal level includes metal lines 544 and the via level includes contacts (not shown). The metal lines and contacts may be formed by, for example, dual damascene processes. The metal lines and contacts may be copper or copper alloy lines and contacts. Other types of conductive lines and contacts, including forming them using damascene or reactive ion etch (RIE) processes may also be useful. The metal level and via level, for example, are $M_1$ and $V_{i-1}$ of the $i^{th}$ ILD level. A next ILD level i+1 ILD level is disposed over the $i^{th}$ ILD level. The next ILD level, for example, includes metal level $M_{i+1}$ and via level $V_i$. Similar to the metal and via levels of the $i^{th}$ ILD level, metal lines 544 and via contacts (not shown) are provided in the $M_{i+1}$ and $V_i$.

As shown, the metal level $M_1$ includes metal lines separated by dielectric material of the $i^{th}$ metal level. The metal lines include coupling capacitance $C_{ML}$, which is determined by the capacitance of the dielectric material. In one embodiment, the $i^{th}$ metal level includes a negative capacitance (NC) dielectric layer 570. In one embodiment, the NC layer is disposed at a lower portion of the $i^{th}$ metal level and ILD dielectric is disposed in an upper portion of the $i^{th}$ metal level. Other configurations of NC and ILD layers of the $i^{th}$ metal level may also be useful. For example, the NC layer may be disposed over the ILD layer or that there may be multiple NC and/or ILD layers in the $i^{th}$ metal level. The NC dielectric layer, in one embodiment, is a ferroelectric layer. For example, the NC layer may be hafnium-zirconium-oxide (HZO), such as $HfZrO_2$, lead-zirconium-titanate (PZT), such as $PbZrTiO_3$, or barium-titanate-oxide (BTO), such as $BaTiO_3$. Other types of ferroelectric materials or negative capacitance materials may also be useful to form the spacers.

By providing the NC layer intermixed with the ILD layer in the $i^{th}$ metal level, $C_{ML}$ can be defined as follows:

$$C_{ML}=C1+C2$$

where
  C1=capacitance of the NC layer $C_{NC}$, and
  C2=capacitance of the ILD layer $C_{ILD}$.

In one embodiment, the NC layer cannot occupy the whole $i^{th}$ metal layer. This is because $C_{ML}$ is designed to be positive. For example, $C_{ML}$ is greater than 0. By providing a negative C1 having a magnitude less than C2, $C_{ML}$ is positive and reduced. The thickness of the NC layer is selected to produce a negative capacitance having a magnitude less than C2. In the case when there are more than one NC and/or ILD layers in the $i^{th}$ metal level, the thicknesses of the NC layers are calculated and selected to produce a desired overall total capacitance of the NC and total capacitance of the ILD layers.

By providing one or more NC layer in the $i^{th}$ metal level, coupling capacitance is reduced. Reduced coupling capacitance improves signal transmission speed and integrity. This improves device performance and reliability.

FIGS. 6a-6g show an embodiment of a process for forming a device 600. The process relates to the formation metal lines in BEOL processing in a device. The process forms a device which is similar to that described in FIG. 5. Common elements may not be described or described in detail.

The device, for example, includes a substrate (not shown) with ILD levels. An $i^{th}$ ILD level 520 of a BEOL dielectric with x ILD levels is shown, where i is from 1 to x. For example, the $i^{th}$ level can be any ILD level of the device. As shown, metal lines are provided in metal level $M_1$. The metal lines, for example, are copper or copper alloy metal lines. Other types of metal lines may also be useful. The metal lines may be formed by damascene or dual damascene techniques. For example, in the case of damascene techniques, trenches are formed in the $M_1$ dielectric layer and filled with metal to form the metal lines. In the case of dual damascene techniques, trenches are formed in the $M_1$ dielectric layer while vias are formed in the $V_{i-1}$ dielectric layer and filled with metal to form the metal lines and via contacts. For the case where the metal lines are formed by damascene or dual techniques (single or dual), the $M_1$ dielectric layer is removed after the metal lines are formed. In an alternative embodiment, the $M_1$ metal lines may be formed by RIE techniques. For example, metal is formed and patterned to form the metal lines.

Figure 6B:
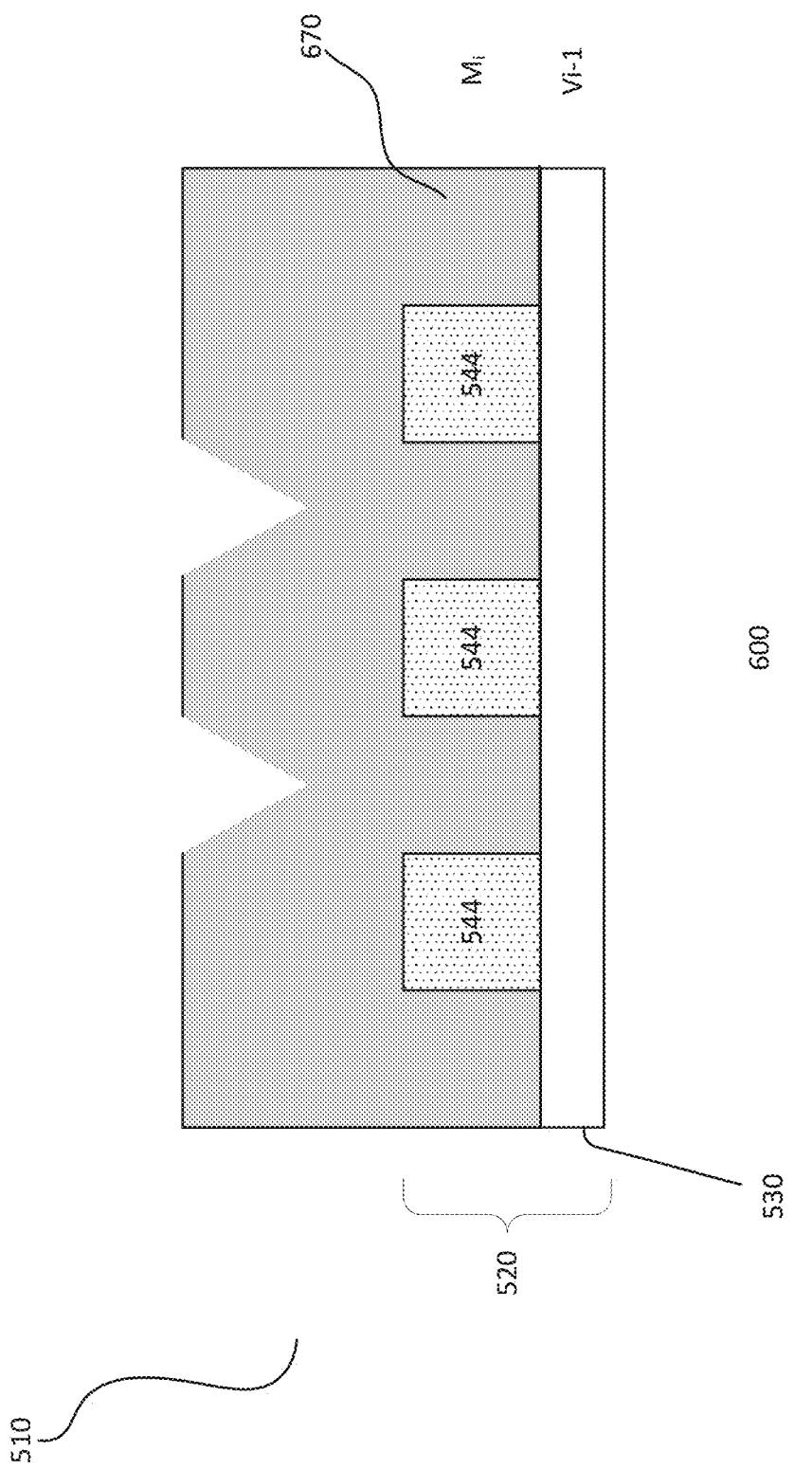

Referring to FIG. 6b, a NC dielectric layer 670 is formed on the substrate. The NC dielectric layer, in one embodiment, is a ferroelectric layer. For example, the NC layer may be hafnium-zirconium-oxide (HZO), such as $HfZrO_2$, lead-zirconium-titanate (PZT), such as $PbZrTiO_3$, or barium-titanate-oxide (BTO), such as $BaTiO_3$. Other types of ferroelectric materials or negative capacitance materials may also be useful to form the NC dielectric layer. The NC dielectric layer may be formed by, for example, CVD. Other techniques for forming the NC dielectric layer, such as atomic laser deposition (ALD) or atomic laser chemical vapor deposition (ALCVD), may also be useful. The NC dielectric layer, in one embodiment, fills the gaps between the metal lines as well as covering them.

In FIG. 6c, the substrate is planarized. In one embodiment, the substrate is planarized to remove excess NC material over the metal lines. As shown, the NC layer and metal lines are coplanar. Planarizing the substrate, in one embodiment, includes polishing the substrate surface. For example, chemical mechanical polishing (CMP) is employed to planarize the substrate surface. Other planarizing techniques may also be useful.

Figure 6D:
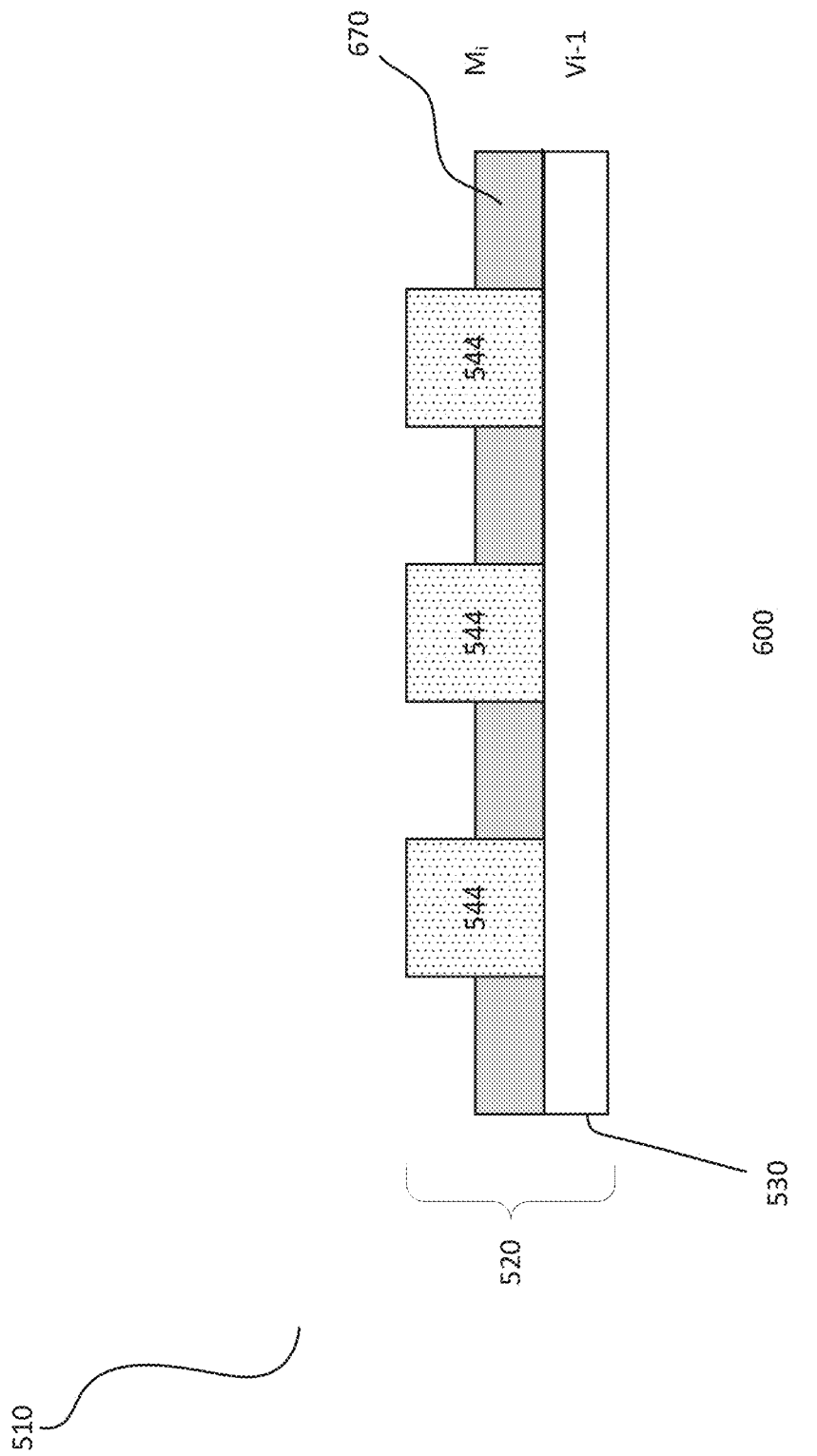

Referring to FIG. 6d, an etch back process is performed. The etch back process, for example, is a RIE. The etch back process selectively etches the NC layer, recessing it to below the top surface of the metal lines. In one embodiment, the etch back reduces the thickness of the NC layer between the metal lines to a desired thickness. For example, the thickness of the NC material produces the desired negative capacitance $C_{NC}$. The thickness, for example, may be about 20-50 nm. Other thicknesses may also be useful. The $C_{NC}$ should be less than $C_{ILD}$ to produce a positive $C_{ML}$. For example, $C_{ML}>0$. A positive $C_{ML}$ results in stable operations of the device.

In one embodiment, a dielectric layer 640 is formed on the substrate, as shown in FIG. 6e. The dielectric layer, for example, may be silicon oxide. For example, the dielectric layer may be TEOS formed by CVD. Other types of dielectric layers, such as low-k dielectric layers may also be useful. The dielectric layer, for example, may be the same material used in forming the ILD levels. The dielectric layer fills the gaps between the metal lines as well as covering them.

After forming the dielectric layer, the substrate is planarized. In one embodiment, the substrate is planarized to remove excess dielectric material over the metal lines. As shown, the dielectric layer and metal lines are coplanar. Planarizing the substrate, in one embodiment, includes polishing the substrate surface. For example, CMP is employed to planarize the substrate surface. Other planarizing techniques may also be useful. This completes the process for forming $M_i$.

Referring to FIG. 6f, after completing the $i^{th}$ ILD level, processing for the $(i+1)^{th}$ ILD level may commence. For example, a cap dielectric liner (not shown) may be formed on the substrate coving $M_i$ dielectric and $M_i$ metal lines. The dielectric liner may be a low k dielectric liner. For example, the dielectric liner may be nBLOK. The cap liner may be formed by chemical vapor deposition (CVD). Other types of dielectric materials or forming techniques for the cap liner may also be useful. Thereafter, a dielectric layer 612 may be formed on the substrate. The dielectric layer may serve as the $i^{th}+1$ ILD level, which includes $V_i$ and $M_{i+1}$.

Figure 6G:
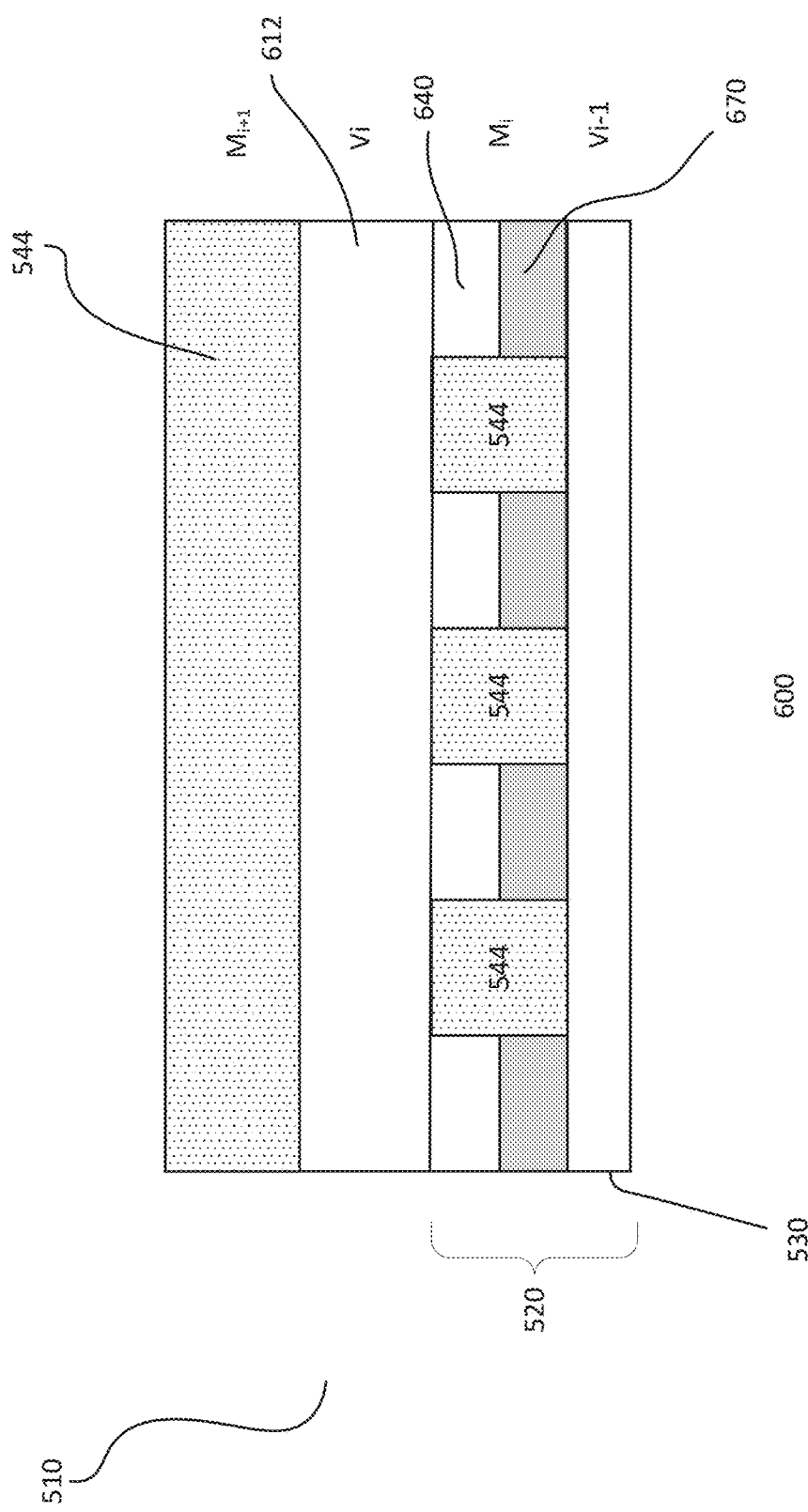

In FIG. 6g, metal lines 544 are formed in $M_{i+1}$. The process may continue to form NC layers as well as completing $M_{i+1}$, as described from FIGS. 6a-e. Additional processes may be performed to complete forming the device. For example, additional processes may include forming additional ILD levels, pad interconnect level, passivation, dicing the wafer to singulate the devices for packaging. Other types of processes may also be performed.

The present disclosure may be embodied in other specific forms without departing from the spirit or essential characteristics thereof. The foregoing embodiments, therefore, are to be considered in all respects illustrative rather than limiting the invention described herein. Scope of the disclosure is thus indicated by the appended claims, rather than by the foregoing description, and all changes that come within the meaning and range of equivalency of the claims are intended to be embraced therein.

What is claimed is:

1. A semiconductor device comprising:
   a substrate including a circuit component; and
   an interlevel dielectric level over the substrate, the interlevel dielectric level including a first dielectric layer, a second dielectric layer over the first dielectric layer, and a plurality of metal lines over the first dielectric layer, the plurality of metal lines partially disposed in the second dielectric layer,
   wherein the second dielectric layer is comprised of a ferroelectric material.

2. The semiconductor device of claim 1 further comprising:
   a third dielectric layer over the second dielectric layer,
   wherein the plurality of metal lines are partially disposed in the third dielectric layer.

3. The semiconductor device of claim 2 wherein the ferroelectric material is comprised of hafnium-zirconium-oxide, lead-zirconium-titanate, or barium-titanate-oxide, and the third dielectric layer is comprised of silicon dioxide.

4. The semiconductor device of claim 2 wherein the ferroelectric material is comprised of hafnium-zirconium-oxide, lead-zirconium-titanate, or barium-titanate-oxide, and the third dielectric layer is comprised of a low-k dielectric material.

5. The semiconductor device of claim 2 wherein the plurality of metal lines have a first thickness, the second dielectric layer has a second thickness, the third dielectric layer has a third thickness, and the first thickness is substantially equal to a sum of the second thickness and the third thickness.

6. The semiconductor device of claim 2 wherein the third dielectric layer and the plurality of metal lines are co-planar.

7. The semiconductor device of claim 2 wherein the second dielectric layer and the third dielectric layer each include portions arranged in a layer stack between the plurality of metal lines.

8. The semiconductor device of claim 2 wherein a total overlap capacitance is represented by a sum of a first capacitance of the second dielectric layer and a second capacitance of the third dielectric layer, the first capacitance is negative or equal to zero, a magnitude of the first capacitance is less than a magnitude of the second capacitance, and the total overlap capacitance is positive.

9. The semiconductor device of claim 1 wherein the ferroelectric material is comprised of hafnium-zirconium-oxide, lead-zirconium-titanate, or barium-titanate-oxide.

10. The semiconductor device of claim 1 wherein the plurality of metal lines are connected to the circuit component.

11. The semiconductor device of claim 1 wherein the second dielectric layer includes respective portions arranged between the plurality of metal lines.

12. The semiconductor device of claim 11 wherein the plurality of metal lines have a first thickness, and the portions of the second dielectric layer have a second thickness that is less than the first thickness.

13. A method comprising:
   forming a circuit component on a substrate;
   forming a first dielectric layer of an interlevel dielectric level over the substrate;

forming a plurality of metal lines of the interlevel dielectric level over the first dielectric layer; and forming a second dielectric layer over the first dielectric layer that partially fills spaces between the plurality of metal lines, wherein the second dielectric layer is comprised of a ferroelectric material.

14. The method of claim 13 wherein forming the second dielectric layer on the first dielectric layer that partially fills the spaces between the plurality of metal lines comprises:

planarizing the second dielectric layer relative to the plurality of metal lines; and recessing the second dielectric layer relative to the plurality of metal lines with an etch back process.

15. The method of claim 13 further comprising:

forming a third dielectric layer over the second dielectric layer, wherein the plurality of metal lines are partially disposed in the third dielectric layer.

16. The method of claim 15 wherein the plurality of metal lines have a first thickness, the second dielectric layer has a second thickness, the third dielectric layer has a third thickness, and the first thickness is substantially equal to a sum of the second thickness and the third thickness.

17. The method of claim 15 wherein the second dielectric layer and the third dielectric layer each include portions arranged in a layer stack between the plurality of metal lines.

18. The method of claim 15 wherein the third dielectric layer and the plurality of metal lines are co-planar.

19. The method of claim 13 wherein the ferroelectric material is comprised of hafnium-zirconium-oxide, lead-zirconium-titanate, or barium-titanate-oxide.

20. The method of claim 13 wherein the second dielectric layer includes respective portions arranged between the plurality of metal lines, the plurality of metal lines have a first thickness, and the portions of the second dielectric layer have a second thickness that is less than the first thickness.

* * * * *